United States Patent
Saugier

(10) Patent No.: US 8,586,450 B2
(45) Date of Patent: Nov. 19, 2013

(54) PROCESS FOR FABRICATING SEMICONDUCTOR DEVICES AND A SEMICONDUCTOR DEVICE COMPRISING A CHIP WITH THROUGH-VIAS

(75) Inventor: Eric Saugier, Lancey (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 263 days.

(21) Appl. No.: 13/103,191

(22) Filed: May 9, 2011

(65) Prior Publication Data

US 2011/0278733 A1 Nov. 17, 2011

(30) Foreign Application Priority Data

May 17, 2010 (FR) ...................................... 10 53784

(51) Int. Cl.
    *H01L 21/30* (2006.01)
(52) U.S. Cl.
    USPC ........... 438/455; 438/456; 438/457; 438/458; 438/459
(58) Field of Classification Search
    USPC .................................. 438/455–459
    See application file for complete search history.

(56) References Cited

U.S. PATENT DOCUMENTS

| | | |
|---|---|---|
| 2003/0080410 A1 | 5/2003 | Shibata |
| 2006/0231958 A1* | 10/2006 | Yang .............................. 257/777 |
| 2007/0045875 A1 | 3/2007 | Farnworth et al. |
| 2007/0287265 A1* | 12/2007 | Hatano et al. ................. 438/458 |
| 2008/0217761 A1 | 9/2008 | Yang et al. |
| 2010/0224965 A1* | 9/2010 | Kuo .............................. 257/621 |

OTHER PUBLICATIONS

French Search Report mailed Dec. 15, 2010 for FR 1053784 (2 pages).

* cited by examiner

*Primary Examiner* — Jae Lee
(74) *Attorney, Agent, or Firm* — Gardere Wynne Sewell LLP

(57) ABSTRACT

A semiconductor device includes a first wafer having at least one first integrated-circuit chip and a first support layer surrounding the first integrated circuit chip. A first electrical-connection layer is placed on a frontside of the first wafer and includes a first electrical-connection network. A second wafer is placed on a frontside of the first electrical-connection layer. The second wafer includes at least one second integrated-circuit chip and a second support layer surrounding the second integrate circuit chip. The second integrated circuit chip has an active side facing the first electrical-connection layer, and one or more through-holes filled with a conductor forming electrical-connection vias. A second electrical-connection layer is placed on the backside of the second wafer and includes a second electrical-connection network.

24 Claims, 5 Drawing Sheets

PROCESS FOR FABRICATING SEMICONDUCTOR DEVICES AND A SEMICONDUCTOR DEVICE COMPRISING A CHIP WITH THROUGH-VIAS

PRIORITY CLAIM

This application claims priority from French Application for Patent No. 1053784 filed May 17, 2010, the disclosure of which is hereby incorporated by reference.

TECHNICAL FIELD

The present invention relates to the field of semiconductor devices.

BACKGROUND

It is more and more common to use integrated-circuit chips having through-holes to produce electrical connections from one side to the other and to integrate such chips in complex assemblies of superposed chips. To do this, it has been proposed to produce, on the active sides of the chips of a wafer comprising a plurality of chips, blind holes that are filled with and electrical conductor; to mount this chip-bearing wafer on a thick support wafer by placing the active sides of the chips against this support wafer; to thin the chip-bearing wafer until the conductor that forms then electrical-connection vias is exposed; to assemble other chips on the backside of the thinned chip-bearing wafer, optionally by way of a layer integrating electrical-connection networks and by encapsulating these other chips; to remove the support wafer; to produce an electrical-connection layer on the frontside of the chip-bearing wafer; and finally to dice the resulting wafer so as to singulate the semiconductor devices.

It will be immediately noticed that such a procedure requires many operations and requires the use of a support wafer as a tool on which the semiconductor devices are fabricated.

SUMMARY

It is proposed to simplify the fabrication of assemblies especially of integrated-circuit chips comprising at least one chip with electrical-connection through-vias.

According to one method of implementation, a process for fabricating semiconductor devices comprises the following steps.

A first wafer is produced that comprises, in certain locations, first integrated-circuit chips and a first support layer surrounding these first chips, a frontside of which wafer comprises a frontside of the first support layer and the active sides of the first chips.

A first electrical-connection layer having a frontside and comprising, on said locations, first electrical-connection networks is produced on the frontside of the first wafer, for electrically connecting one side of this first layer to the other side thereof.

Second integrated-circuit chips are installed, on said locations, and a second support layer surrounding these chips is formed so as to form an intermediate wafer, these second chips having active sides on the first-electrical-connection-layer side and blind holes that are open on the first-electrical-connection-layer side and filled with a conductor, forming electrical-connection vias.

The thickness of the intermediate wafer is reduced so as to construct a second wafer comprising thinned second chips and a thinned second support layer in which the vias of the thinned second chips have exposed front parts.

A second electrical-connection layer having a frontside and comprising, on said locations, second electrical-connection networks is produced on the second wafer for electrically connecting one side of this second layer to the other side thereof.

Thus a semiconductor device, which will possibly be singulated, is obtained at each location of the resulting structure.

It is furthermore possible to produce, on said locations, through-holes in the second thinned support layer and to fill these holes with a conductor so to form electrical-connection vias.

It is also possible to place, on said locations, discrete external electrical-connection means on the second electrical-connection layer.

It is also possible to dice the resulting wafer so as to singulate each semiconductor device obtained.

Also proposed is a semiconductor device comprising a first wafer comprising at least one first integrated-circuit chip and a support layer surrounding this first chip, a frontside of which wafer comprises a frontside of the first support layer and the active side of the first chip; a first electrical-connection layer placed on the frontside of the first wafer, the first electrical-connection layer having a frontside and comprising a first electrical-connection network for electrically connecting one side of this second layer to the other side thereof; a second wafer placed on a frontside of the first electrical-connection layer and comprising at least one second integrated-circuit chip, and a support layer surrounding this second chip, the second chip having an active side on the first-electrical-connection-layer side and through-holes filled with a conductor forming electrical-connection vias; and a second electrical-connection layer placed on the second wafer, the second electrical-connection layer having a frontside and comprising a second electrical-connection network for electrically connecting one side of this layer to the other side thereof.

The first chip and the second chip may be connected by way of the first electrical-connection network.

The first chip may be connected to front electrical-connection means by way of the first electrical-connection network, at least some of the vias passing through the second chip and the second electrical-connection network.

The second chip is connected to front electrical-connection means by way of at least some of the electrical-connection vias passing through the second chip and the second electrical-connection network.

Electrical-connection vias passing through the support layer of the second wafer may furthermore be provided, these vias possibly being connected to the first electrical-connection network and to the second electrical-connection network.

The first support layer, the electrical-connection layer, the support layer and the electrical-connection layer may be made of the same base material.

BRIEF DESCRIPTION OF THE DRAWINGS

Processes for fabricating semiconductor devices and the resulting semiconductor devices will now be described by way of non-limiting examples, illustrated with the drawings in which.

DETAILED DESCRIPTION OF THE DRAWINGS

Figure 9:
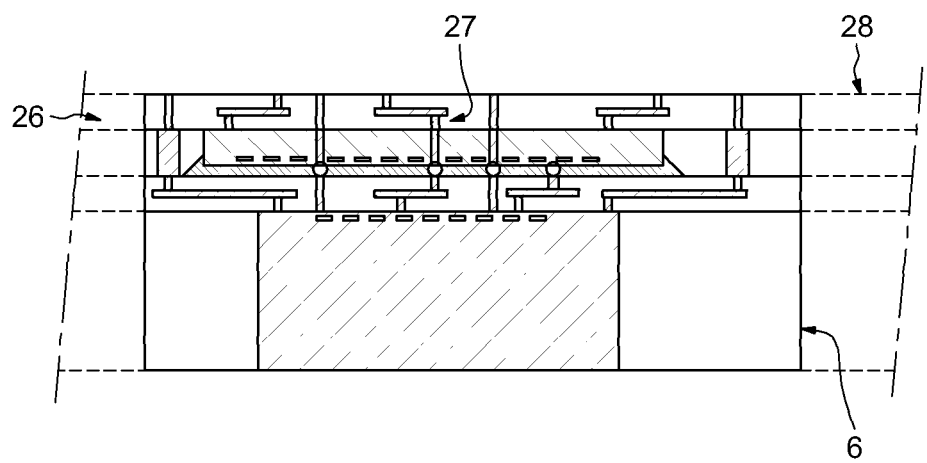
FIG. 9 shows a cross section of the semiconductor structure, according to a subsequent fabrication step, integrating second electrical-connection networks.
Figure 10:
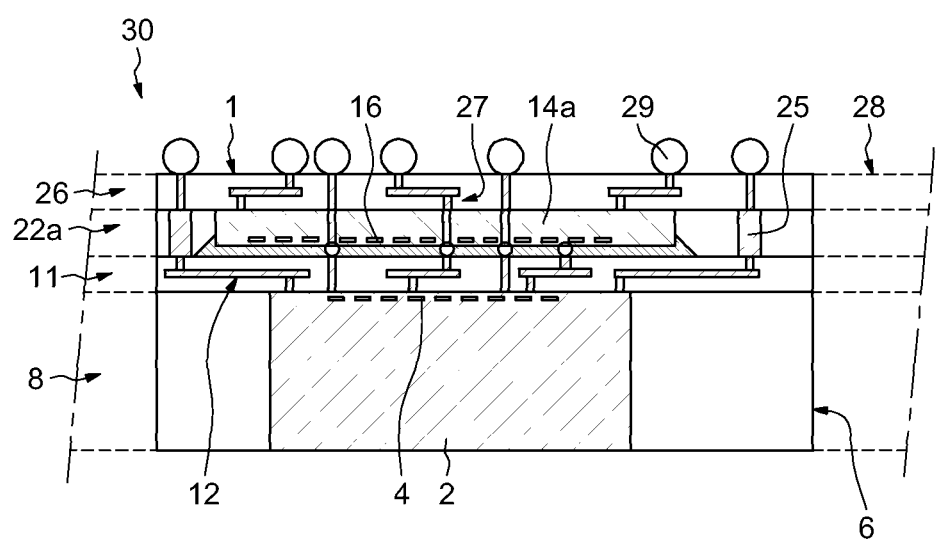
FIG. 10 shows a cross section of the semiconductor structure, according to a subsequent fabrication step, integrating external electrical-connection means.
Figure 11:
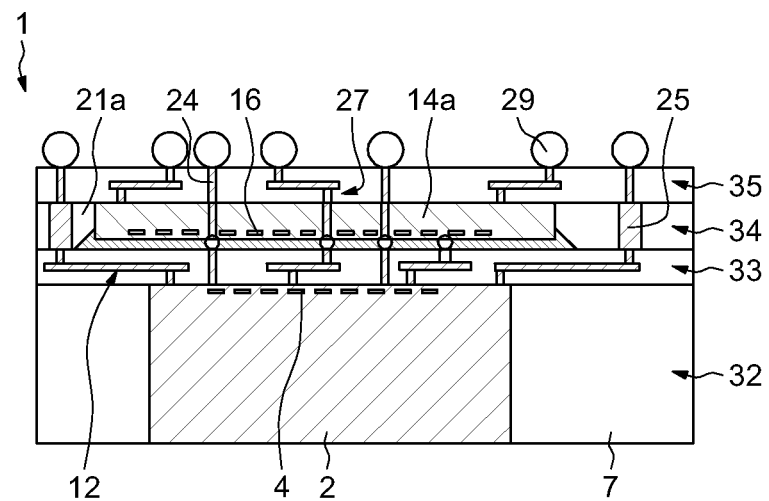
FIG. 11 shows a cross section of a semiconductor device obtained.

With reference to FIGS. 1 to 10, the various steps for fabricating semiconductor devices 1, such as illustrated in FIG. 11, will now first be described.

Figure 1:
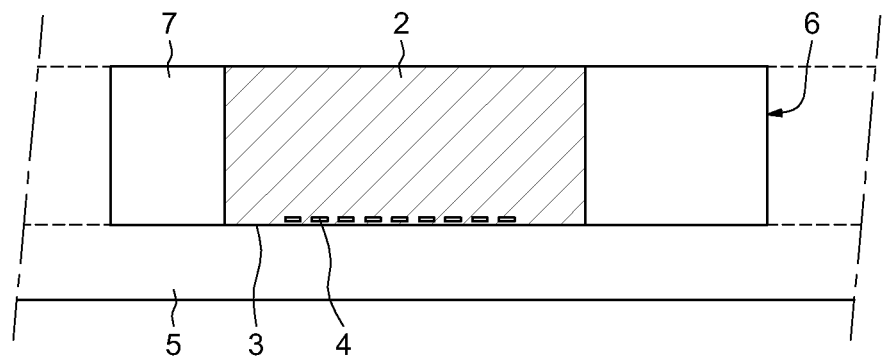
FIG. 1 shows a cross section of a semiconductor structure, according to one fabrication step, integrating first integrated-circuit chips.

As illustrated in FIG. 1, having produced beforehand a thick wafer bearing first chips 2 having, on an active side 3, integrated circuits 4, this wafer is diced so as to singulate the first chips 2.

Next, the active sides 3 of these singulated first chips 2 are placed on a construction wafer 5, the first chips 2 being spaced out and arranged in a square matrix defining adjacent locations 6. The first chips 2 may be held in place by a temporary bonding means. A first support layer 7 is then deposited around the plurality of first chips 2, this support layer 7 being for example a curable resin that has for example a thickness equal to that of the first chips 2.

Figure 2:
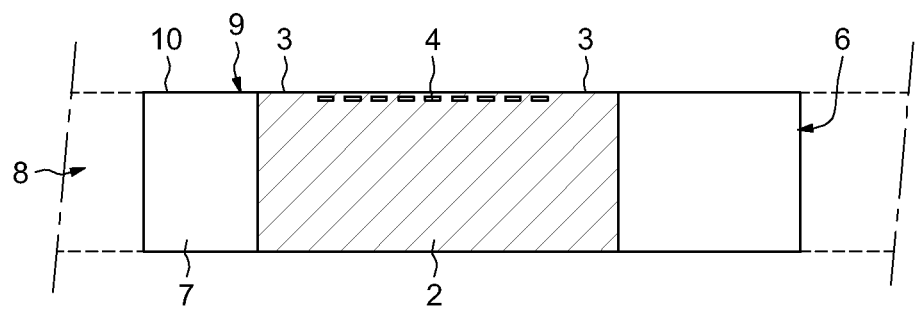
FIG. 2 shows a cross section of the semiconductor structure that results from FIG. 1.

After the first support layer 7 has been cured and the construction wafer 5 has been separated, a first wafer 8 is obtained, as illustrated in FIG. 2, which has a frontside 9 that comprises a frontside 10 of the first support layer 7 and the active sides 3 of the first chips 2.

The first wafer 8 advantageously forms a support, on which the operations that will now be described are carried out, and will be a component of the semiconductor devices that will be obtained.

Figure 3:
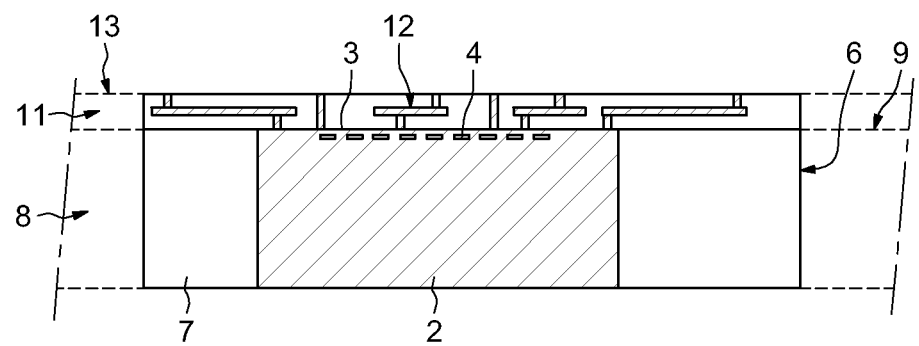
FIG. 3 shows a cross section of the semiconductor structure, according to a subsequent fabrication step, integrating first electrical-connection networks.

As illustrated in FIG. 3, a first electrical-connection layer 11 is produced on the frontside 9 of the first wafer 8, which layer comprises or integrates networks 12 for electrical connection from one side to the other, respectively placed in the locations 6, this first electrical-connection layer 11 having a frontside 13. The electrical-connection networks 12 may have one or more electrical-connection levels.

Figure 4:
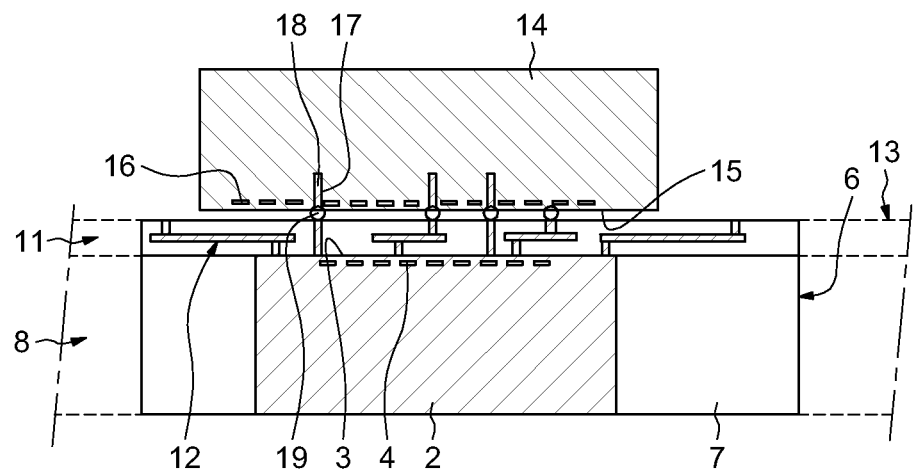
FIG. 4 shows a cross section of the semiconductor structure, according to a subsequent fabrication step for placing second integrated-circuit chips equipped with vias.

As illustrated in FIG. 4, having produced beforehand a thick wafer bearing second chips 14 having integrated circuits 16 on an active side 15 and having, extending from this active side 15, blind holes 17 filled with an electrical conductor intended to form electrical-connection vias 18, this wafer is diced so as to singulate the second chips 14.

Next, the second chips 14 are mounted on the frontside 13 of the first electrical-connection layer 11, respectively in the locations 6, by placing the active sides 15 of the second chips 14 on the side of the first electrical-connection layer 11 and by interposing small bumps 19 for electrical connection.

Figure 5:
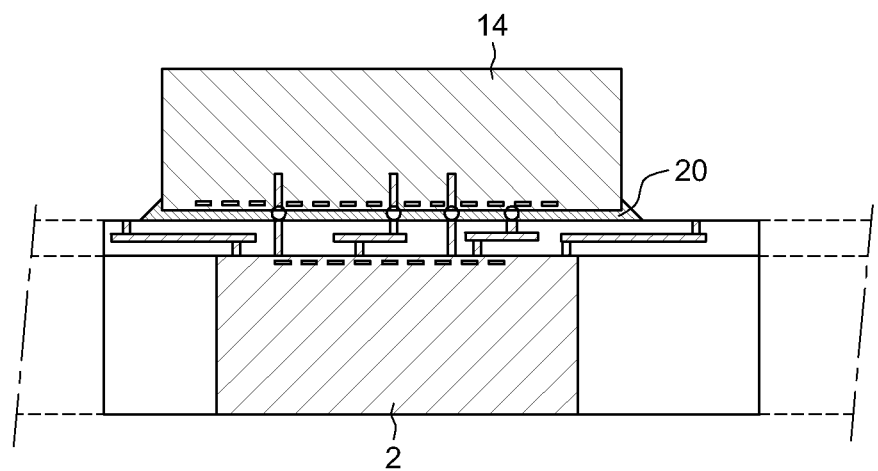
FIG. 5 shows a cross section of the semiconductor structure according to a subsequent fabrication step for the placement of a filler.

Next, as illustrated in FIG. 5, a filler 20, for example a very fluid resin, is injected into the space between the frontside 13 of the electrical-connection layer 11 and the active sides 15 of the second chips 14, this resin spreading around the bumps 19.

Figure 6:
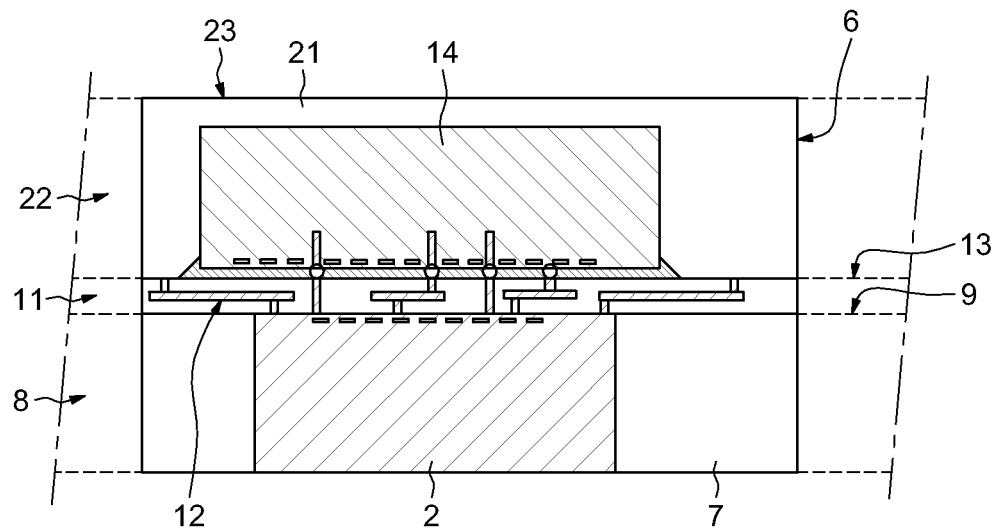
FIG. 6 shows a cross section of the semiconductor structure, according to a subsequent fabrication step, integrating second integrated-circuit chips.

Next, as illustrated in FIG. 6, a second support layer 21 is deposited around and optionally on the plurality of second chips 14, this support layer 7 being for example a curable resin.

After the second support layer 21 has been cured, an intermediate wafer 22 having a frontside 23 is obtained.

Figure 7:
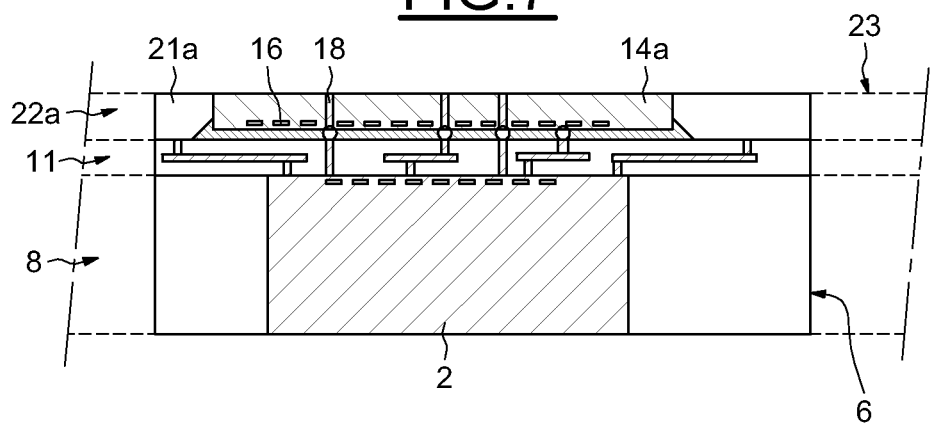
FIG. 7 shows a cross section of the semiconductor structure, according to a subsequent fabrication step, showing a thickness reduction.

After this, the thickness of the intermediate wafer 22 is reduced, for example by mechanically polishing its frontside 23, until, as illustrated in FIG. 7, a second wafer 22a comprising a plurality of thinned second chips 14a and a thinned second support layer 21a is obtained, the second wafer 22a having a frontside 23a. The front parts of the electrical-connection vias 18 of the second chips 14 are thus exposed, for electrical connections from one side to the other.

Figure 8:
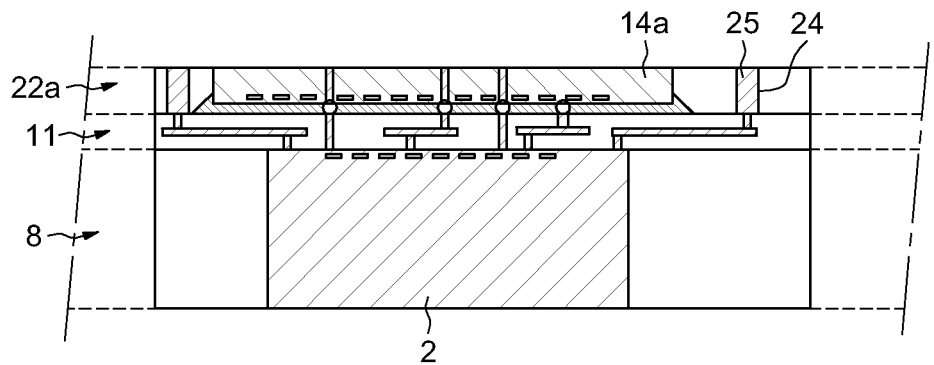
FIG. 8 shows a cross section of the semiconductor structure, according to a subsequent fabrication step, integrating complementary vias.

As illustrated in FIG. 8, it is possible to optionally then produce, in the locations 6, through-holes 24 in the thinned second support layer 21a in places around the thinned second chips 14a and then to fill these holes 24 with an electrical conductor so as to form electrical-connection vias 25.

Next, as illustrated in FIG. 9, a second electrical-connection layer 26 is produced on the frontside 23a of the second wafer 22a, which layer comprises or integrates networks 27 for electrical connections from one side to the other, respectively placed in the locations 6, this second electrical-connection layer 26 having a frontside 28. The electrical-connection networks 27 may have one or more electrical-connection levels.

Next, as illustrated in FIG. 10, it is possible to deposit on the frontside 28 of the second electrical-connection layer 26 electrical connection bumps 29.

A resulting structure 30 having, in the locations 6, adjacent semiconductor devices 1 is thus obtained.

Finally, the resulting wafer 30 is diced, for example using a saw, between or along the locations 6, in order to singulate as many semiconductor devices 1 as there are locations 6.

As illustrated in FIG. 11, each semiconductor device 1 comprises, as a stack: a first wafer 32, corresponding to a portion of the first wafer 8, equipped with a first chip 2 surrounded by a support layer 7; a first electrical-connection layer 33, corresponding to a portion of the first electrical-connection layer 11, equipped with a first electrical-connection network 12; a second wafer 34, corresponding to a portion of the second wafer 8, equipped with a thinned second chip 14a and with a thinned support layer 21a; a second electrical-connection layer 35, corresponding to a portion of the second electrical-connection layer 26, equipped with a second electrical-connection network 27; and a plurality of bumps 29 for external electrical connection.

By distributing, during fabrication of the semiconductor devices, as described above, the electrical-connection networks 12 and 27, the electrical-connection vias 18 passing through the thinned second chip 14a and the complementary electrical-connection vias 25 passing through the thinned support layer 22a, it is possible to selectively establish, at will, electrical connections between the integrated circuits 4 of the first chip 2 and the integrated circuits 16 of the second chip 14a and the external electrical connection bumps 29.

The electrical-connection vias 18 passing through the thinned second chip 14a may be selectively connected, laterally, to the integrated circuits 16 or connected to the latter by way of the electrical-connection network 12 or establish links directly between the electrical-connection networks 12 and 27.

The electrical-connection networks 12 and 27 of the interconnect layers 11 and 26, and the optional electrical-connection vias 25 may allow the active sides 3 and 15 of the integrated-circuit chips 2 and 14 (14a) to be freed from electrical-connection leads.

It may be advantageous to use the same base material for the first support layer 7, for the electrical-connection layer 11, for the support layer 21 and for the electrical-connection layer 26, for example a resin.

Figure 12:
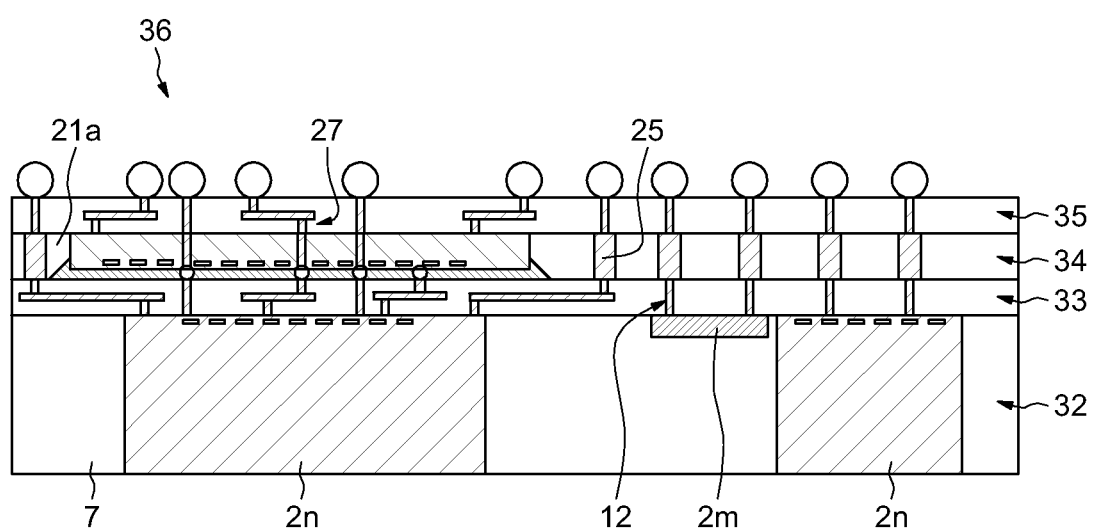
FIG. 12 shows a cross section of a variant embodiment of a semiconductor device obtained.

As illustrated in FIG. 12, semiconductor devices 36, obtained by the process described above, may comprise, in the wafer 32, several, optionally different, first chips 2n, and optionally one or more other discrete components 2m having sides adjacent to the electrical-connection layer 11 and connected to the first electrical-connection network 12. The thickness of the initial first wafer 8 may be adapted to the thickest first chip or discrete component.

Likewise, several second chips 14a, at least some having electrical-connection through-vias 18, could be provided in the second wafer 34.

In addition, after the step illustrated in FIG. 9, and before the bump electrical connections 29 are put in place, the construction of the semiconductor devices could be continued (not shown) by reproducing, one or more times, the operations described with reference to FIGS. 6 to 8 on the frontside 28 of the electrical-connection layer, so as to adjoin at least one new second integrated-circuit chip, optionally provided with electrical-connection through-vias.

Of course, the various fabrication operations described above may be carried out employing means commonly used in the field of microelectronics.

The present invention is not limited to the examples described above. Many other variants are possible without departing from the scope defined by the appended claims.

What is claimed is:

1. A process for fabricating a semiconductor device, comprising:
   producing a first wafer comprising, at a first location, a first integrated-circuit chip and a first support layer surrounding the first location and said first integrated circuit chip, the first wafer having a frontside which comprises a frontside of the first support layer and an active side of the first integrated circuit chip;
   producing on the frontside of the first wafer a first electrical-connection layer having a frontside and comprising, on said first location, a first electrical-connection network configured to electrically connect one side of said first electrical-connection layer to another side of said first electrical-connection layer;
   installing, over said first location, a second integrated-circuit chip on said frontside of the first electrical-connection layer;
   forming a second support layer surrounding the second integrated circuit chip so as to form a second wafer, wherein the second integrated circuit chip has an active side facing toward and in electrical contact with the first electrical-connection layer and further having one or more through electrical-connection vias; and
   producing on the second wafer a second electrical-connection layer having a frontside and comprising, over said first location, a second electrical-connection network configured to electrically connect one side of said second electrical-connection layer to another side of said second electrical-connection layer.

2. The process according to claim 1, wherein the first wafer includes plural first integrated circuit chips adjacent to each other and separated by the first support layer, and the second wafer includes plural second integrated circuit chips separated by the second support layer, the process further comprising producing an individual semiconductor device at each first location of an overall wafer.

3. The process according to claim 1, comprising, before constructing the second electrical-connection layer: producing one or more through-holes in the second support layer; and filling said through holes with a conductor so to form one or more electrical-connection vias in contact with the first electrical connection layer.

4. The process according to claim 1, further comprising: placing discrete external electrical-connection means on the frontside of said second electrical-connection layer.

5. The process according to claim 2, further comprising: dicing the overall wafer so as to singulate each individual semiconductor device.

6. The process according to claim 1, further comprising: placing a discrete electrical component in the first support layer adjacent the first integrated-circuit chip, wherein the first electrical-connection layer is electrically connected to the discrete electrical component.

7. The process according to claim 6, further comprising: producing one or more electrical connection vias in the second support layer in electrical contact with the first electrical-connection layer and the discrete electrical component.

8. The process according to claim 7, wherein the second electrical-connection layer is electrically connected to the one or more electrical connection vias in the second support layer.

9. A process for fabricating a semiconductor device, comprising:
   producing a first wafer comprising, at a first location, a first integrated-circuit chip and a first support layer surrounding the first location and said first integrated circuit chip, the first wafer having a frontside which comprises a frontside of the first support layer and an active side of the first integrated circuit chip;
   producing on the frontside of the first wafer a first electrical-connection layer having a frontside and comprising, on said first location, a first electrical-connection network configured to electrically connect one side of said first electrical-connection layer to another side of said first electrical-connection layer;
   installing, over said first location, a second integrated-circuit chip on said frontside of the first electrical-connection layer;
   wherein the second integrated-circuit chip includes one or more blind holes that are open towards the first electrical-connection layer and filled with a conductor;
   forming a second support layer surrounding the second integrated circuit chip so as to form a second wafer, wherein the second integrated circuit chip has an active side facing and in electrical contact with the first electrical-connection layer and further having one or more through electrical-connection vias;
   reducing a thickness of the second integrated-circuit chip and second support layer to form the second wafer, wherein reducing the thickness exposes the electrical connection vias of the thinned second integrated circuit chip so as to form said one or more through electrical-connection vias; and producing on the second wafer a second electrical-connection layer having a frontside and comprising, over said first location, a second electrical-connection network configured to electrically connect one side of said second electrical-connection layer to another side of said second electrical-connection layer.

10. A process for fabricating a semiconductor device, comprising:

producing a first wafer including a first integrated-circuit chip and a first support layer surrounding the first integrated circuit chip, the first wafer having a frontside formed by a frontside of the first support layer which is coplanar with an active circuit front side of the first integrated circuit chip;

producing on the frontside of the first wafer a first electrical-connection layer having a frontside and including a first electrical-connection network in electrical connection with circuits on the active circuit front side of the first integrated circuit chip;

installing a second integrated-circuit chip on said frontside of the first electrical-connection layer, said second integrated circuit chip including an active circuit front side facing toward and in electrical contact with the first electrical-connection layer and further including at least one through silicon electrical connection via extending through the second integrated-circuit chip and in electrical contact with the first electrical-connection layer;

forming a second support layer surrounding the second integrated circuit chip to produce a second wafer having a having a frontside formed by a frontside of the second support layer which is coplanar with a backside of the second integrated circuit chip; and producing on the second wafer a second electrical-connection layer having a frontside and comprising a second electrical-connection network configured to electrically connect to the through silicon via of the second integrated-circuit chip.

11. The process according to claim 10, wherein the first wafer includes plural first integrated-circuit chips adjacent to each other and separated by the first support layer, and wherein the second wafer includes plural second integrated-circuit chips separated by the second support layer, the process further comprising producing a plurality of individual semiconductor devices, each device including at least one first integrated-circuit chip and at least one second integrated-circuit chip.

12. The process according to claim 10, further comprising producing at least one electrically conductive via passing through the second support layer surrounding the second integrated circuit chip to make electrical connection to the first electrical-connection network of the first electrical connection layer.

13. The process according to claim 12, wherein the second electrical-connection network is configured to electrically connect to the at least one electrically conductive via.

14. The process according to claim 10, further comprising:
placing a discrete external electrical-connection structure on a frontside surface of said second electrical-connection layer in electrical connection with the second electrical-connection network.

15. The process according to claim 10, further comprising: dicing an overall wafer formed from the first and second wafer so as to singulate an individual semiconductor device which includes said first integrated-circuit chip and said second integrated-circuit chip.

16. The process according to claim 10, further comprising: placing a discrete electrical connection structure between the through silicon via of the second integrated-circuit chip and the active circuit front side of the first integrated circuit chip.

17. The process according to claim 16, further comprising encapsulating around said discrete electrical component.

18. A process for fabricating a semiconductor device comprising:

producing a first wafer including a first integrated-circuit chip and a first support layer surrounding the first integrated circuit chip, the first wafer having a frontside formed by a frontside of the first support layer which is coplanar with an active circuit front side of the first integrated circuit chip;

producing on the frontside of the first wafer a first electrical-connection layer having frontside and including a first electrical-connection network in electrical connection with circuits on the active circuit front side of the first integrated circuit chip;

installing a second integrated-circuit chip on said frontside of the first electrical-connection layer, said second integrated circuit chip including an active circuit front side facing and in electrical contact with the first electrical-connection layer and further including at least one through silicon electrical connection via extending through the second integrated-circuit chip and in electrical contact with the first electrical-connection layer;

forming a second support layer surrounding the second integrated circuit chip to produce a second wafer having a having a frontside formed by a frontside of the second support layer which is coplanar with a backside of the second integrated circuit chip;

thinning the second integrated circuit chip and second support layer to expose said through silicon electrical connection via; and producing on the second wafer a second electrical-connection layer having a frontside and comprising a second electrical-connection network configured to electrically connect to the through silicon via of the second integrated-circuit chip.

19. A process for fabricating a semiconductor device, comprising:

producing a first support layer surrounding a first integrated circuit chip and having a first frontside formed by a frontside of the first support layer which is coplanar with an active circuit frontside of the first integrated circuit chip;

producing a first electrical-connection layer on said first frontside and having a second frontside, said first electrical-connection layer including a first electrical-connection network in electrical connection with circuits on the active circuit frontside of the first integrated circuit chip;

installing a second integrated-circuit chip with an active circuit front side facing toward the second frontside of the first electrical-connection layer and in electrical contact with the first electrical-connection network, said second integrated-circuit chip including at least one through silicon electrical connection also in electrical contact with the first electrical-connection network;

forming a second support layer surrounding the second integrated circuit chip and having a third frontside formed by a frontside of the second support layer which is coplanar with a backside of the second integrated circuit chip; and producing a second electrical-connection layer on said third frontside and having a second electrical-connection network configured to electrically connect to the through silicon via of the second integrated-circuit chip.

20. The process according to claim 19, further comprising producing at least one electrically conductive via passing through the second support layer surrounding the second integrated circuit chip to make electrical connection to the first electrical-connection network of the first electrical connection layer, wherein producing comprises forming blind holes in the second integrated circuit chip that are filled with conductive material and thinning the second integrated circuit chip and second support layer to expose the conductive material.

21. The process according to claim 20, wherein the second electrical-connection network is further configured to electrically connect to the at least one electrically conductive via.

22. The process according to claim 20, further comprising:
placing a discrete electrical connection ball between the through silicon via of the second integrated-circuit chip and the active circuit front side of the first integrated circuit chip.

23. The process according to claim 22, further comprising encapsulating around said discrete electrical component.

24. The process according to claim 20, further comprising:
placing a discrete external electrical connection ball on a fourth frontside of said second electrical-connection layer in electrical connection with the second electrical-connection network.

* * * * *